US008191427B2

(12) United States Patent
Hattori et al.

(10) Patent No.: US 8,191,427 B2
(45) Date of Patent: Jun. 5, 2012

(54) PRESSURE SENSITIVE SENSOR AND MANUFACTURING METHOD THEREOF

(75) Inventors: Masato Hattori, Kosai (JP); Masaaki Shimizu, Kosai (JP)

(73) Assignee: ASMO Co., Ltd., Shizuoka-pref. (JP)

( * ) Notice: Subject to any disclaimer, the term of this patent is extended or adjusted under 35 U.S.C. 154(b) by 0 days.

(21) Appl. No.: 12/974,011

(22) Filed: Dec. 21, 2010

(65) Prior Publication Data

US 2011/0185819 A1 Aug. 4, 2011

(30) Foreign Application Priority Data

Jan. 29, 2010 (JP) ................................. 2010-019519

(51) Int. Cl.
*G01L 9/00* (2006.01)
*G08B 21/00* (2006.01)
*G01R 27/26* (2006.01)

(52) U.S. Cl. ........................... 73/753; 324/601; 340/657

(58) Field of Classification Search ............. 73/700–756
See application file for complete search history.

(56) References Cited

U.S. PATENT DOCUMENTS 5,206,785 A * 4/1993 Hukashima ................ 361/283.2
6,339,305 B1 1/2002 Ishihara et al.
2003/0056600 A1* 3/2003 Shank et al. .................... 73/780
2009/0146668 A1* 6/2009 Wuerstlein .................... 324/663
2009/0146827 A1* 6/2009 Wuerstlein et al. ........... 340/657
2009/0256578 A1* 10/2009 Wuerstlein et al. ........... 324/601
2010/0050787 A1* 3/2010 Abert et al. .............. 73/862.626
2011/0232391 A1* 9/2011 Ruby et al. ...................... 73/768

FOREIGN PATENT DOCUMENTS

JP 2004-342456 A 12/2004

* cited by examiner

*Primary Examiner* — Andre Allen
(74) *Attorney, Agent, or Firm* — Posz Law Group, PLC

(57) ABSTRACT

A molten dielectric resin material is filled in a section of an inside of a hollow dielectric body, in which electrode wires are installed. The molten dielectric resin material is solidified to form filler resin, so that the hollow dielectric body has a sensor portion, in which the filler resin is not filled in the inside of the hollow dielectric body, and a non-sensor portion, in which the filler resin is filled in the inside of the hollow dielectric body. A power supply connector is installed to one end part of the hollow dielectric body located at the non-sensor portion side and includes a plurality of electrically conductive terminals that are electrically connected to the plurality of electrode wires.

10 Claims, 6 Drawing Sheets

PRESSURE SENSITIVE SENSOR AND MANUFACTURING METHOD THEREOF

CROSS REFERENCE TO RELATED APPLICATION

This application is based on and incorporates herein by reference Japanese Patent Application No. 2010-19519 filed on Jan. 29, 2010.

BACKGROUND OF THE INVENTION

1. Field of the Invention

The present invention relates to a pressure sensitive sensor and manufacturing method thereof.

2. Description of Related Art

In a power sliding door apparatus (also known as an electric sliding door apparatus), a door panel is driven by a drive force outputted from an electric motor to open or close an entrance/exit opening (also known as a sliding door opening) of a vehicle. It has been proposed to place a pressure sensitive sensor (also known as a pinch sensor) at the door panel to sense presence of an foreign object (e.g., a human body) between an inner peripheral part of the entrance/exit opening of the vehicle and the door panel to limit pinching of the foreign object between the inner peripheral part of the entrance/exit opening and the door panel.

For instance, Japanese Unexamined Patent Publication No. H11-283459A (corresponding to U.S. Pat. No. 6,339,305B1) and Japanese Unexamined Patent Publication No. 2004-342456A teach such a pressure sensitive sensor that includes an elongated sensor cable, which is placed along a front end part of the door panel. The elongated sensor cable includes a plurality of electrode wires, which are received in a resiliently deformable elongated hollow dielectric body and are connected in series through a resistor. In this type of pressure sensitive sensor, two electrode wires are pulled out from a proximal end part of the hollow dielectric body and are electrically connected to one end parts of power supply lead lines, respectively, through clamping pieces (caulking pieces) at a terminal coupler. Here, each of the clamping pieces is radially inwardly bent to clamp a corresponding one of the electrode wires and a corresponding one of the one end parts of the power supply lead lines. Furthermore, at each of the clamping pieces, the electrode wire and the one end part of the power supply lead line are securely joined to the clamping piece by welding. The other end parts of the lead lines, which are opposite from the terminal coupler, are connected to an electrical power source, so that electric current is supplied from the electric power source to the electrode wires through the lead lines. In general, the lead lines are connected to the electric power source through a power supply connector, which is provided to the other end parts of the lead lines opposite from the terminal coupler.

In this type of pressure sensitive sensor, when the foreign object does not contact the sensor cable, the electrode wires, which are received in the hollow dielectric body, do not contact with each other. Thereby, the electric current, which is supplied through the lead lines (power supply lines), flows from one of the electrode wires, which has a high electric potential, to the other one of the electrode wires, which has a low electric potential, through the resistor. In contrast, when the foreign object contacts the sensor cable to apply an urging force against the sensor cable, the electrode wires, which are received in the hollow dielectric body, contact with each other to cause short circuiting therebetween. Thereby, the electric current, which is supplied through the lead lines (power supply lines), flows from the one of the electrode wires, which has the high electric potential, to the other one of the electrode wires, which has the low electric potential, without passing through the resistor. In this way, a current value of the electric current, which is supplied to the electric wires at a predetermined constant voltage, is changed. Thereby, the urging force, which is applied from the foreign object to the sensor cable, is sensed based on this change in the current value. That is, the foreign object, which contacts the sensor cable, is sensed based on the change in the electric current.

However, in the case of the pressure sensor, in which the power supply lead lines are connected to the sensor cable in the above described manner, the lead lines and the terminal coupler, which includes the multiple components, are connected to the end part of the sensor cable. Therefore, the number of the components is disadvantageously increased. Furthermore, at the time of electrically connecting the electrodes of the electrode wires and the lead lines, each of the electrodes and the corresponding clamping piece are joined, together by welding, and each of the lead lines and the corresponding clamping piece are joined together by welding. Therefore, the work required for connecting the electrodes and the lead lines becomes disadvantageously tedious. This may possibly result in a reduction in the productivity. Thereby, the manufacturing costs may be disadvantageously increased.

SUMMARY OF THE INVENTION

The present invention is made in view of the above disadvantages. Thus, it is an objective of the present invention to provide a pressure sensitive sensor and a manufacturing method thereof, which enables minimization of the number of components of the pressure sensitive sensor and enables simple manufacturing of the pressure sensitive sensor.

According to the present invention there is provided a manufacturing method of a pressure sensitive sensor that includes a hollow dielectric body, which is elongated and is resiliently deformable, and a plurality of electrode wires, which are normally spaced from each other while being opposed to each other in an inside of the hollow dielectric body and are contactable with each other upon bending of at least one of the plurality of electrode wires caused by resilient deformation of the hollow dielectric body. In the manufacturing method, a molten dielectric resin material is filled into a section of the inside of the hollow dielectric body, in which the plurality of electrode wires is installed, to provide a non-sensor portion in the section of the inside of the hollow dielectric body filled with the molten dielectric resin material. Then, the molten dielectric resin material is solidified to form filler resin after the filling of the molten dielectric resin material, so that a sensor portion, in which the filler resin is not filled in the inside of the hollow dielectric body, and the non-sensor portion, in which the filler resin is filled in the inside of the hollow dielectric body, are formed. Thereafter, a power supply connector having a plurality of electrically conductive terminals is installed to one end part of the hollow dielectric body located at the non-sensor portion side such that the plurality of electrically conductive terminals is electrically connected to the plurality of electrode wires after the solidifying of the molten dielectric resin material.

According to the present invention, there is also provided a pressure sensitive sensor, which includes a hollow dielectric body and a plurality of electrode wires. The hollow dielectric body is, elongated and is resiliently deformable. The electrode wires are normally spaced from each other while being opposed to each other in an inside of the hollow dielectric body and are contactable with each other upon bending of at least one of the plurality of electrode wires caused by resilient deformation of the hollow dielectric body. The hollow dielectric body, in which the plurality of electrode wires is installed, includes a sensor portion, in which dielectric filler resin is not filled in the inside of the hollow dielectric body to enable contact of the plurality of electrode wires with each other, and a non-sensor portion, in which the filler resin is filled in the inside of the hollow dielectric body to disable the contact of the plurality of electrode wires with each other. A power supply connector is provided to one end part of the hollow dielectric body located at the non-sensor portion side and includes a plurality of electrically conductive terminals that are electrically connected to the plurality of electrode wires.

BRIEF DESCRIPTION OF THE DRAWINGS

The invention, together with additional objectives, features and advantages thereof, will be best understood from the following description, the appended claims and the accompanying drawings in which:

DETAILED DESCRIPTION OF THE INVENTION

An embodiment of the present invention will be described with reference to the accompanying drawings.

Figure 1:
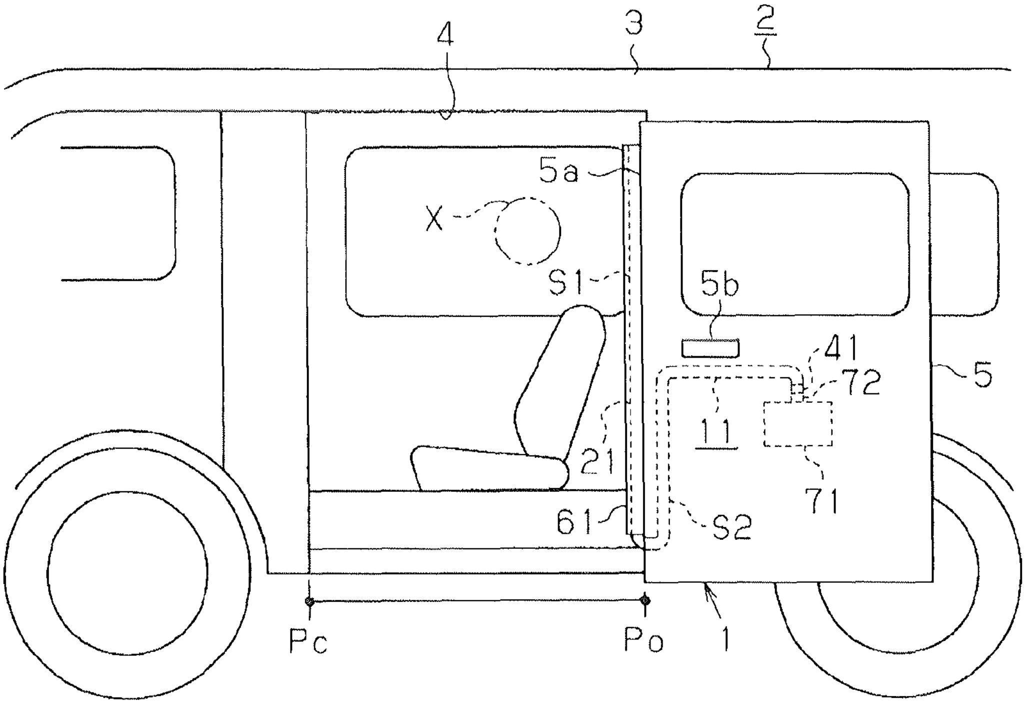
FIG. 1 is a schematic view of a vehicle having a power sliding door apparatus according to an embodiment of the present invention.

FIG. 1 is a schematic view of a vehicle 2 having a power sliding door apparatus (also known as an electric sliding door apparatus) 1 of the present embodiment. As shown in FIG. 1, the vehicle 2 has a vehicle body 3 made of an electrically conductive metal material. An entrance/exit opening (sliding door opening) 4, which is configured into a rectangular form, is formed on a left lateral side of the vehicle body 3. The entrance/exit opening 4 is opened or closed with a door panel 5, which is made of an electrically conductive metal material and is configured into a rectangular form that corresponds to the entrance/exit opening 4.

The door panel 5 is installed to the vehicle body 3 such that the door panel 5 is slidable in a front-to-rear direction of the vehicle 2 (both the left direction and the right direction in FIG. 1). Furthermore, a drive mechanism (not shown), which includes a sliding door actuator 6 (see FIG. 2), is connected to the door panel 5. When the sliding door actuator 6 is driven, the door panel 5 undergoes an opening/closing movement such that the door panel 5 is slid in the front-to-rear direction of the vehicle 2 (one of the left direction and the right direction in FIG. 1) to open or close the entrance/exit opening 4.

Figure 2:
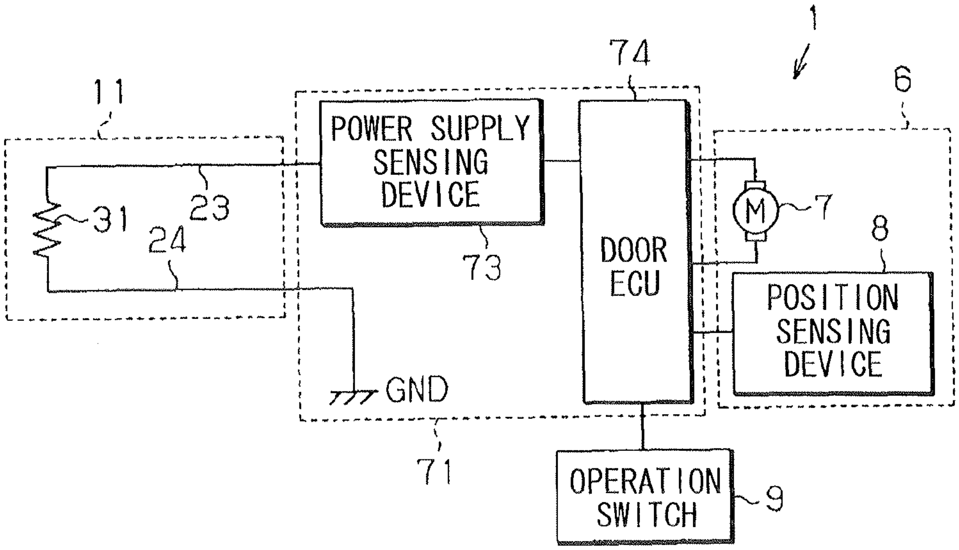
FIG. 2 is a block diagram showing an electrical structure of the power sliding door apparatus.

As shown in FIG. 2, the sliding door actuator 6 includes a sliding door motor (drive motor) 7 and a speed reducing mechanism (not shown). The speed reducing mechanism reduces a speed of rotation, which is transmitted from the sliding door motor 7, and outputs the rotation of the reduced speed. A position sensing device 8, which senses the rotation of the sliding door motor 7, is placed in the sliding door actuator 6. The position sensing device 8 includes a permanent magnet and a Hall IC (not shown). The permanent magnet is adapted to rotate integrally with a rotatable shaft (not shown) of the sliding door motor 7 or a speed reducing gear (not shown) of the speed reducing mechanism. The Hall IC is opposed to the permanent magnet. The Hall IC outputs a pulse signal, which serves as a position sensing signal and corresponds to a change, in a magnetic field of the permanent magnet caused by, the rotation of the permanent magnet.

The power sliding door apparatus 1 further includes an operation switch 9, through which the occupant of the vehicle 2, inputs a corresponding command to open or close the door panel 5. With reference to FIGS. 1 and 2, when the occupant of the vehicle 2 manipulates the operation switch 9 to drive the door panel 5 to open the entrance/exist opening 4, the operation switch 9 outputs an opening command signal, which commands the corresponding slide movement of the door panel 5 to open the entrance/exit opening 4 by driving the sliding door motor 7. In contrast, when the occupant of the vehicle 2 manipulates the operation switch 9 to drive the door panel 5 to close the entrance/exit opening 4, the operation switch 9 outputs a closing command signal, which commands the corresponding slide movement of the door panel 5 to close the entrance/exit opening 4 by driving the sliding door motor 7. The operation switch 9 is provided to, for example, a predetermined location in a passenger compartment of the vehicle 2 (e.g., a dashboard), a door lever 5*b* of the door panel 5 or a hand-held item (not shown) that is carried along with an ignition key of the vehicle 2.

Furthermore, the power sliding door apparatus 1 includes a pressure sensitive sensor (pinch sensor) 11, which senses a foreign object X (see FIG. 1) present in a gap between a front end part 5*a* of the door panel 5 and an inner peripheral part of the entrance/exit opening 4.

Figure 3A:
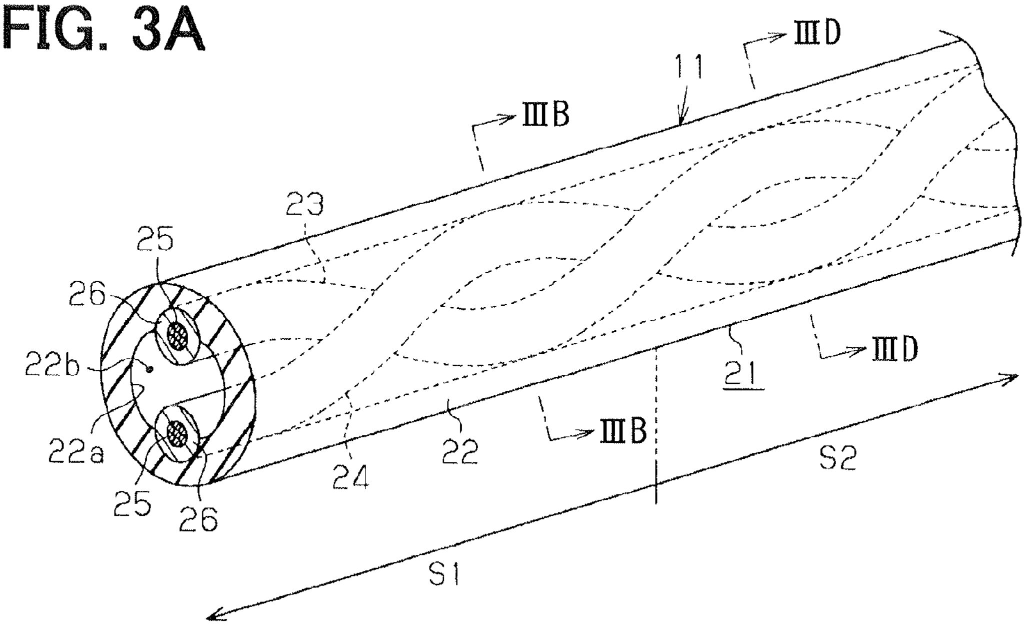
FIG. 3A is a partial enlarged perspective view of a pressure sensitive sensor of the power sliding door apparatus shown in FIG. 1.
Figure 3B:
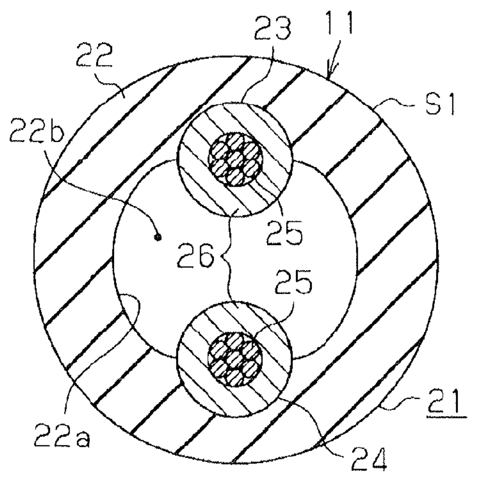
FIG. 3B is a cross-sectional view taken along line IIIB-IIIB in FIG. 3A, showing a state before application of an urging force to the pressure sensitive sensor.

As shown in FIG. 1, a sensor cable 21 of the pressure sensitive sensor 11 is configured as an elongated cable. As shown in FIGS. 3A and 3B, a hollow dielectric body 22 of the sensor cable 21 is configured into a cylindrical tubular form and is made of a resiliently deformable dielectric material (e.g., soft resin material or rubber material), which is transparent, dielectric and resilient. A spacing hole 22*a* is formed in a radial center part of the hollow dielectric body 22, i.e., is formed to extend along a central axis of the hollow dielectric body 22 to penetrate through the hollow dielectric body 22 in the axial direction, i.e., a longitudinal direction of the hollow dielectric body 22 in a state where the hollow dielectric body 22 is straightened on a flat floor, as show in FIG. 3A. The spacing hole 22*a* provides a hollow space 22*b* in the inside of the hollow dielectric body 22 (i.e., the hollow dielectric body 22 being hollow).

Furthermore, two electrode wires 23, 24 are held in the inside of the hollow dielectric body 22. Each electrode wire 23, 24 includes a center electrode 25 and an electrically conductive cover layer (cover sheath) 26. The center electrode 25 is formed as a stranded electrode, which is flexible and is formed by stranding a plurality of fine conductive lines. The electrically conductive cover layer 26 is electrically conductive and is resilient. Furthermore, the electrically conductive cover layer 26 is configured into a cylindrical tubular form and surrounds the center electrode 25. The electrode wires 23, 24 are circumferentially spaced from each other at the inside of the hollow dielectric body 22 and are spirally wound along the longitudinal direction of the hollow dielectric body 22. In the present embodiment, the electrode wires 23, 24, which are placed in the inside of the hollow dielectric body 22, are diametrically opposed to each other in the diametric direction of the hollow dielectric body 22 at any point along the length of the hollow dielectric body 22. A circumferential half of each of the electrode wires 23, 24 is embedded in the hollow dielectric body 22.

Figure 4:
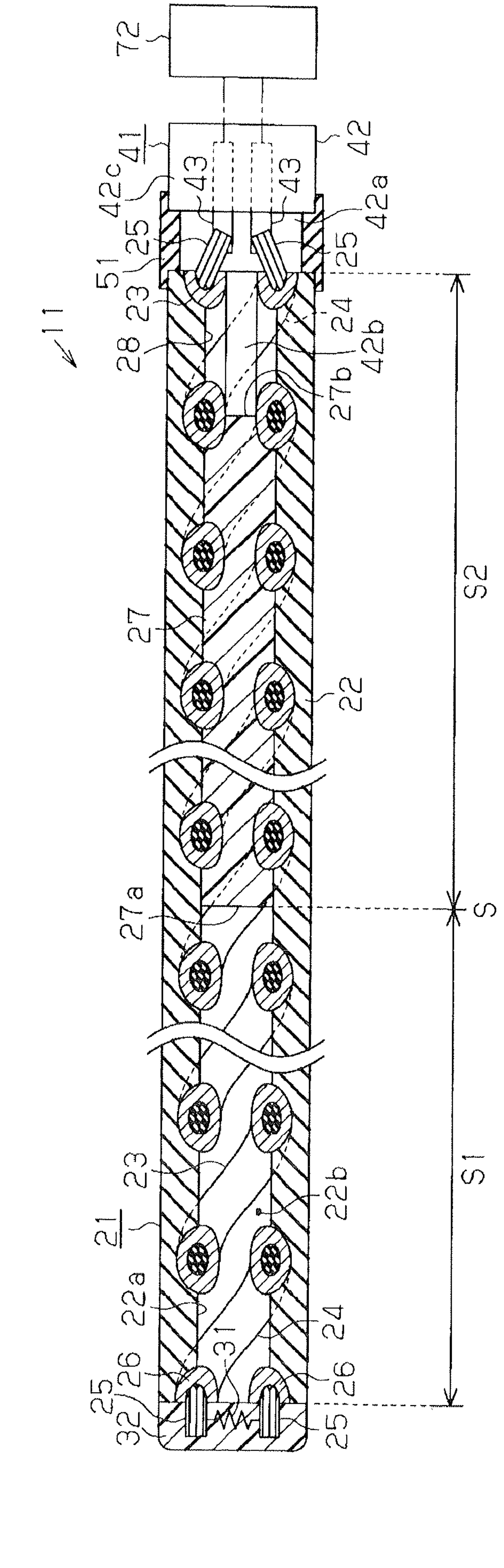
FIG. 4 is a cross sectional view, schematically showing a longitudinal cross section of the pressure sensitive sensor of the embodiment.

As shown in FIG. 4, filler resin 27 is filled in a predetermined longitudinal section of the interior (i.e., the hollow space 22*b*) of the hollow dielectric body 22. In FIG. 4, the length of the elongated pressure sensitive sensor 11 is shortened by eliminating a portion of the elongated pressure sensitive sensor 11. The above predetermined section is set to correspond with a received portion of the sensor cable 21, which is received in the interior of the door panel 5 (see FIG. 1), and the filler resin 27 is a piece of resin, which is dielectric and resilient.

Figure 3D:
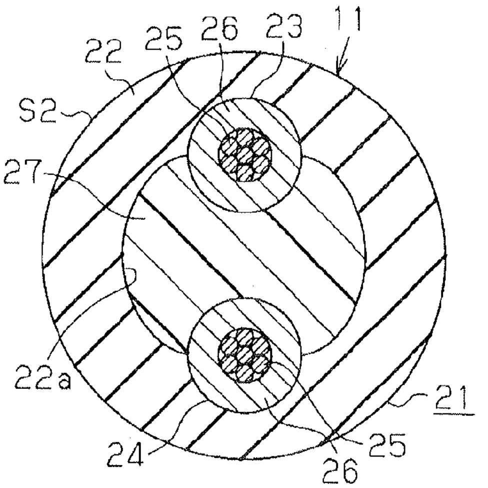
FIG. 3D is a cross-sectional view taken along line IIID-IIID in FIG. 3A.

One of two opposed ends of the filler resin 27, which is located closer to a longitudinal center part of the hollow dielectric body 22, will be hereinafter referred to as a first end 27*a*, and the other one of the opposed ends of the filler resin 27 (the right end in FIG. 4) will be hereinafter referred to as a second end 27*b*. The sensor cable 21 (and thereby the hollow dielectric body 22) is divided into a sensor portion S1 and a non-sensor portion S2 with reference to a reference point S, which is the first end 27*a* of the filler resin 27. The sensor portion S1 is a region located on one side of the reference point S where the filler resin 27 is not filled (i.e., the region located on the left side of the reference point S in FIG. 4). The non-sensor portion S2 is a region located on the other side of the reference point S where the filler resin 27 is filled (i.e., the region located on the right side of the reference point S in FIG. 4). As shown in FIG. 3B, the sensor portion S1 is not filled with the filler resin 27 in the inside of the hollow dielectric body 22, so that the sensor portion S1 can sense contact of the foreign object X to the sensor portion S1. In contrast, as shown in FIG. 3D, the non-sensor portion S2 is filled with the filler resin 27 in the inside of the hollow dielectric body 22, so that the diametrically opposed electrode wires 23, 24 cannot contact with each other, and thereby the non-sensor portion S2 cannot sense contact of the foreign object X to the non-sensor portion S2. Furthermore, as shown in FIG. 1, the length of the sensor portion S1 measured in the longitudinal direction thereof is generally the same as a vertical length of the front end part 5*a* of the door panel 5 (i.e., the length measured in the top-to-bottom direction of the vehicle 2).

As shown in FIG. 4, the center electrodes 25 of the electrode wires 23, 24 are pulled out from a distal end part (the left end part in FIG. 4) of the hollow dielectric body 22 located at the sensor portion S1 side, and a resistor 31 is connected between the pulled center electrodes 25 of the electrode wires 23, 24. That is, the electrode wires 23, 24 are connected one after another in series through the resistor 31. The distal end part of the hollow dielectric body 22 located at the sensor portion S1 side and the resistor 31 are covered with molded resin 32.

The filler resin 27 is not filled in a proximal end part (the right end part in FIG. 4) of the hollow dielectric body 22 located at the non-sensor portion S2 side, so that the hollow state (empty state) of the interior of the proximal end part of the hollow dielectric body 22 is maintained to provide an insertion gap 28. At the sensor cord 21, a power supply connector 41 is placed at the proximal end part of the hollow dielectric body 22 located at the non-sensor portion S2 side. The power supply connector 41 includes a connector main body 42 and two electrically conductive terminals 43. The connector main body 42 is made of a dielectric resin material, and the terminals 43 are held by the connector main body 42.

The connector main body 42 includes a terminal holding portion 42*a*, a support portion 42*b* and a connecting portion 42*c*. The support portion 42*b* and the connecting portion 42*c* are formed integrally with the terminal holding portion 42*a*. The support portion 42*b* is configured into a column form and projects from the terminal holding portion 42*a*, i.e., projects from the rest of the connector main body 42. A projecting length of the support portion 42*b* measured in the axial direction is generally the same as a length of the insertion gap 28 measured in the axial direction. Furthermore, a thickness of the support portion 42*b* (i.e., a width of the support portion 42*b*, which is measured in a direction perpendicular to the projecting direction of the support portion 42*b*) is generally the same as a size of the gap between the electrode wires 23, 24, which are diametrically opposed to each other in the inside of the hollow dielectric body 22. When the support portion 42*b* is inserted into, i.e., is fitted into the insertion gap 28, the power supply connector 41 is supported relative to the hollow dielectric body 22, and a distal end of the support portion 42*b* contacts the second end 27*b* of the filler resin 27. Furthermore, the connecting portion 42*c* projects from the terminal holding portion 42*a* in an opposite direction, which is opposite from the support portion 42*b*. The connecting portion 42*c* opens in the direction opposite from the support portion 42*b* and is thereby configured into a cup form.

Each of the terminals 43 is made of an electrically conductive metal material and is configured into a strip form. The terminals 43 extend parallel to each other in the projecting direction of the support portion 42*b*. One longitudinal end part of each of the terminals 43 is held in the terminal holding portion 42*a*, and the other longitudinal end part of each of the terminals 43 projects into the connecting portion 42*c*. The terminals 43 are held by the terminal holding portion 42*a* while the terminals 43 are exposed externally from the terminal holding portion 42*a*. Furthermore, the terminals 43 are also exposed externally at the inside of the connecting portion 42*c*. An exposed part of one of the terminals 43, which is exposed from the terminal holding portion 42*a*, is electrically connected by welding to the center electrode 25 of the electrode wire 23, which is pulled out from the proximal end part of the hollow dielectric body 22 located at the non-sensor portion S2 side. Similarly, an exposed part of the other one of the terminals 43, which is exposed from the terminal holding portion 42*a*, is electrically connected by welding to the center electrode 25 of the electrode wire 24, which is pulled out from the proximal end part of the hollow dielectric body 22 located at the non-sensor portion S2 side.

Furthermore, an outer peripheral surface of a connection between the hollow dielectric body 22 and the power supply connector 41 is fluid-tightly covered with a seal member 51. Specifically, the seal member 51 is a heat shrinkable tube and covers an outer peripheral surface of the proximal end part of the hollow dielectric body 22 located at the non-sensor portion S2 side, an outer peripheral surface of the terminal holding portion 42*a* placed adjacent thereto and an outer peripheral surface of a distal end part of the connecting portion 42*c* located at the terminal holding portion 42*a* side. An inner peripheral surface of the seal member 51 tightly contacts the hollow dielectric body 22 and the power supply connector 41 to limit intrusion of liquid into the inside of the hollow dielectric body 22. Furthermore, since the seal member 51 covers the exposed parts of the terminals 43, which are exposed from the terminal holding portion 42*a*, and also covers the connections between the terminals 43 and the center electrodes 25 of the electrode wires 23, 24, so that the seal member 51 also limits adhesion of the fluid to these parts.

The portion of the thus constructed sensor cable 21, which corresponds to the sensor portion S1, is fixed along the front end part 5*a* of the door panel 5 through a holding member 61. Furthermore, a portion (mainly the non-sensor portion S2) of the sensor cable 21, which extends out from a lower end part of the holding member 61, is inserted into the inside of the door panel 5 from a location adjacent to the lower end part of the holding member 61 and is placed to, pass along a predetermined path in the inside of the door panel 5. At this time, since the filler resin 27 is resilient, the deformation (e.g., bending) of the non-sensor portion S2 can be easily made. Furthermore, the power supply connector 41, which is connected to the proximal end part of the sensor cord 21 located at the non-sensor S2 side, is connected to an external connector 72 of a controller 71, which is placed in the inside of the door panel 5.

As shown in FIG. 2, the controller 71 includes a power supply sensing device 73 and a door ECU 74. The door ECU 74 is electrically connected to the power supply sensing device 73. In the state where the sensor cable 21 is connected to the controller 71 through the external connector 72, the electrode wire 23 is electrically connected to the power supply sensing device 73, and the electrode wire 24 is grounded to the ground GND (i.e., grounded to the vehicle body 3).

Figure 3C:
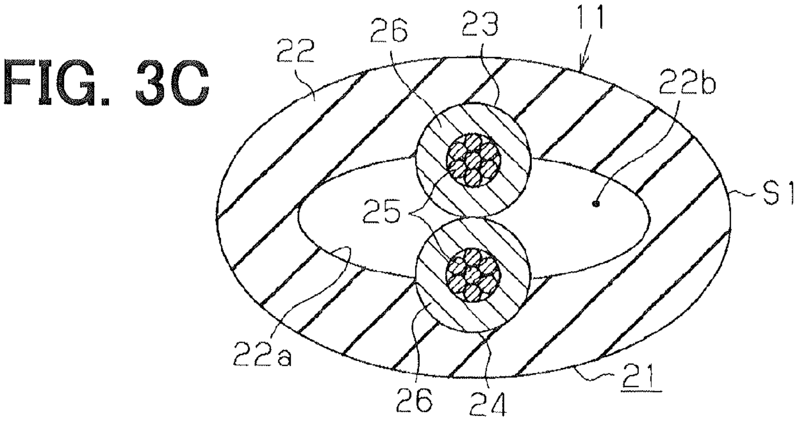
FIG. 3C is a cross-sectional view similar to FIG. 3B, showing a state upon application of the urging force to the pressure sensitive sensor.

The power supply sensing device 73 supplies the electric current to the electrode wires 23, 24 through the power supply connector 41 (see FIG. 1). Furthermore, as shown in FIGS. 2 and 3B, in a normal state where an urging force is not applied to the sensor portion S1 of the sensor cable 21, the electric current, which is supplied from the power supply sensing device 73 to the electrode wire 23, flows to the electrode wire 24 through the resistor 31. In contrast, as shown in FIGS. 2 and 3C, in a state where the sensor portion S1 receives an urging force, which diametrically compress the sensor portion S1, the corresponding portion of the hollow dielectric body 22, to which the urging force is applied, is resiliently deformed, and thereby the electrode wires 23, 24 are flexed, i.e., are bent in response to the resilient deformation of the hollow dielectric body 22 and contact with each other to short circuit therebetween. Thereby, the electric current, which is supplied from the power supply sensing device 73 to the electrode wire 23 flows to the electrode wire 24 without passing through the resistor 31. Therefore, in a case where the electric current is supplied to the electrode wire 23 at a predetermined constant voltage, the value (current value) of the electric current changes upon the occurrence of the short circuiting between the electrode wire 23 and the electrode wire 24. When the power supply sensing device 73 senses the change in the electric current, the power supply sensing device 73 outputs a pressure detection signal to the door ECU 74. When the urging force is removed from the sensor portion S1, the hollow dielectric body 22 returns to its normal shape, so that the electrode wires 23, 24 are also returned to its normal state, thereby being placed in the non-short circuiting state.

As shown in FIG. 2, the door ECU 74 includes a read only memory (ROM) and a random access memory (RAM) and serves as a microcomputer. The door ECU 74 receives the electric power supply from a battery (not shown) of the vehicle 2. The door ECU 74 controls the sliding door actuator 6 based on various singles received from, for example, the operation switch 9, the position sensing device 8 and the power supply sensing device 73.

Next, the operation of the power sliding door apparatus 1 will be described schematically in view of FIGS. 1 and 2.

When the door ECU 74 receives the opening command signal from the operation switch 9, the door ECU 74 drives the sliding door actuator 6 to execute the opening movement of the door panel 5 (i.e., the movement of the door panel 5 in an opening direction thereof). The door ECU 74 recognizes, i.e., determines the position (location) of the door panel 5 based on the position sensing signal, which is received from the position sensing device 8. In the present embodiment, the door ECU 74 counts the number of pulses of the position sensing signal and determines the position of the door panel 5 based on the count value (counted number of the pulses). When the door panel 5 is placed in a full open position Po, at which the door panel 5 fully opens the entrance/exit opening 4, the door ECU 74 stops the sliding door actuator 6.

In contrast, when the door ECU 74 receives the closing command signal from the operation switch 9, the door ECU 74 drives the sliding door actuator 6 to execute the closing movement of the door panel 5 (i.e., the movement of the door panel 5 in a closing direction thereof). When the door panel 5 is, placed in a full close position Pc, at which the door panel 5 fully closes the entrance/exit opening 4, the door ECU 74 stops the sliding door actuator 6. In the middle of the closing movement of the door panel 5, when the foreign object X contacts the sensor portion S1, which is placed in the front end part 5*a* of the door panel 5, to apply the urging force to the sensor portion S1, the hollow dielectric body 22 in the sensor portion S1 is resiliently deformed, so that the electrode wires 23, 24 contact with each other to short circuit therebetween. Thus, the current value of the electric current supplied to the electrode wire 23 is changed, and thereby the power supply sensing device 73 outputs the pressure detection signal to the door ECU 74. When the door ECU 74 receives the pressure detection signal, the door ECU 74 reverses the drive direction of the sliding door actuator 6 to drive the door panel 5 for a predetermined distance in the opening direction thereof and stops the slide actuator 6.

Next, a manufacturing method of the pressure sensitive sensor 11 will be described with reference to FIGS. 5 to 11

Figure 5:
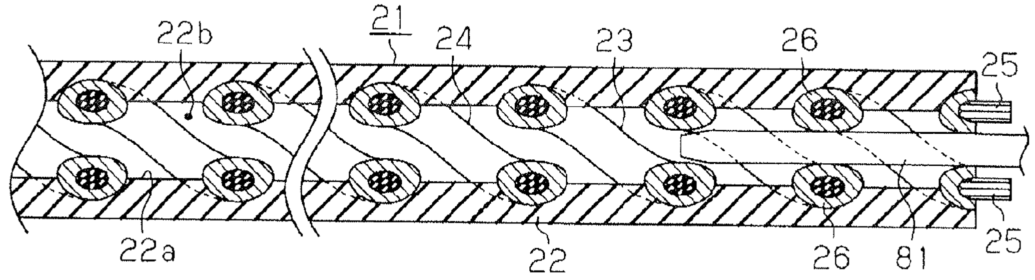
FIG. 5 is a partial cross-sectional view of the pressure sensitive sensor, showing a manufacturing step of the pressure sensitive sensor according to the embodiment.

As shown in FIG. 5, a nozzle inserting step is executed such that a filling nozzle 81 is inserted into the inside of the hollow dielectric body 22 from the proximal end part of the hollow dielectric body 22 (the right end part in FIG. 5). The filling nozzle 81 is inserted into the inside of the hollow dielectric body 22 at least for a distance, which corresponds to the length of the insertion gap 28 in the axial direction (see FIG. 4) to be formed in the longitudinal direction of the hollow dielectric body 22.

Figure 6:
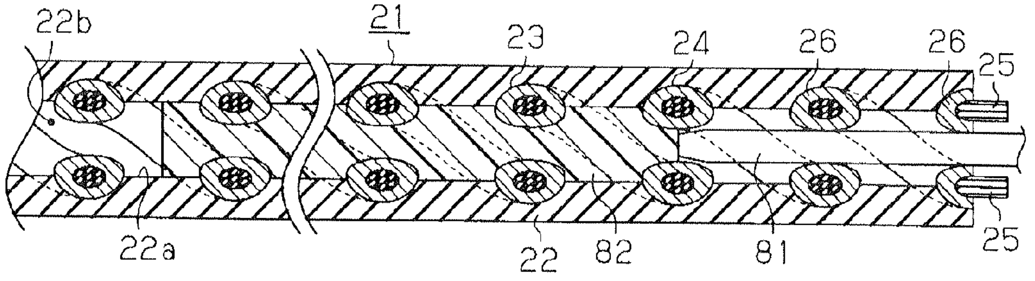
FIG. 6 is a partial cross-sectional view of the pressure sensitive sensor, showing another manufacturing step of the pressure sensitive sensor according to the embodiment.

Next, as shown in FIG. 6, a filling step is executed, so that a molten dielectric resin material 82 is discharged from a distal end of the filling nozzle 81 to fill a predetermined amount of the resin material 82, which corresponds to the length of the non-sensor portion S2 (see FIG. 4) to be formed, into the inside of the hollow dielectric body 22. In this way, the resin material 82 is filled in the corresponding section of the inside of the hollow dielectric body 22, which becomes the non-sensor portion S2.

Figure 7:
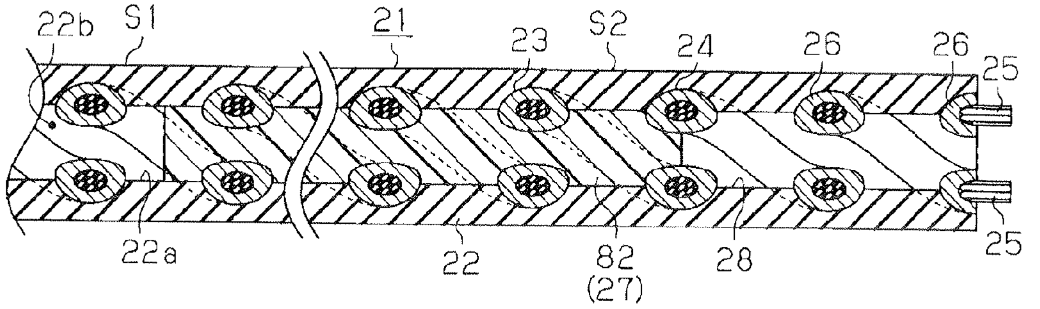
FIG. 7 is a partial cross-sectional view of the pressure sensitive sensor, showing another manufacturing step of the pressure sensitive sensor according to the embodiment.

Next, a gap forming step is executed, so that the filling nozzle 81 is removed from the longitudinal end of the hollow dielectric body 22. In this way, as shown in FIG. 7, the insertion gap 28 is formed in the inside of the proximal end part (the right end part in FIG. 7) of the hollow dielectric body 22 at the location where the filling nozzle 81 has been inserted in the previous step.

Next, a solidifying step is executed, so that the resin material 82, which is filled in the inside of the hollow dielectric body 22, is solidified to form the filler resin 27. In this way, the sensor portion S1, in which the filler resin 27 is not present, and the non-sensor portion S2, in which the filler resin 27 is filled, are formed in the sensor cable 21 (the hollow dielectric body 22).

Figure 8:
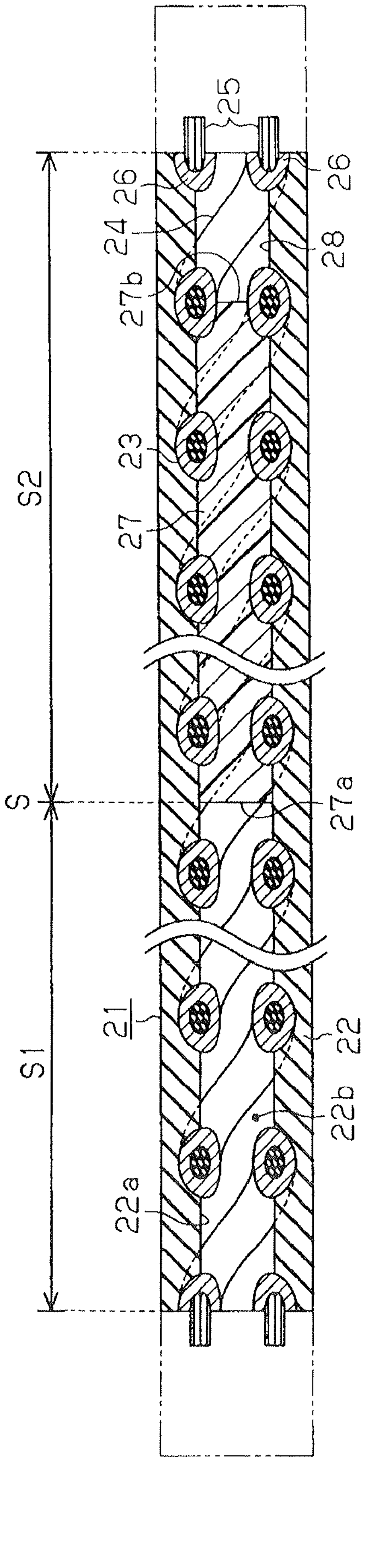
FIG. 8 is a partial cross-sectional view of the pressure sensitive sensor, showing another manufacturing step of the pressure sensitive sensor according to the embodiment.

Next, as shown in FIG. 8, a cutting step is executed, so that the sensor cable 21 is cut to leave a required length (length of the sensor cable 21 measured in the longitudinal direction of the sensor cable 21), which is required to provide the sensor portion S1 and the non-sensor portion S2. In this cutting step, the first end 27*a* of the filler resin 27 (i.e., the one of the opposed ends of the filler resin 27, which is adjacent to the sensor portion S1) is used as the reference point S. Then, a required length of the sensor portion S1, which is required to form the sensor portion S1 is measured from the reference point S toward the side where the filler resin 27 is not filled to form the sensor portion S1, and an excess amount of an end segment (see a left dot-dot-dash line in FIG. 8 indicating the excess end segment) of the sensor cord 21 is cut. Furthermore, a required length of the non-sensor portion S2, which is required to form the non-sensor portion S2, is measured from the reference point S toward the other side where the filler resin 27 is filled to form the non-sensor portion S2, and an excess amount of an end segment (see a right dot-dot-dash line in FIG. 8 indicating the excess end segment) of the sensor cord 21 is cut. The amount of the resin material 82, which is filled in the inside of the hollow dielectric body 22 at the filling step, is appropriately set in view of the length of the non-sensor portion S2. Therefore, even when the required length of the non-sensor portion S2 is measured and is cut, the sufficient length of the insertion gap 28, which is formed in the gap forming step, is left.

Figure 9:
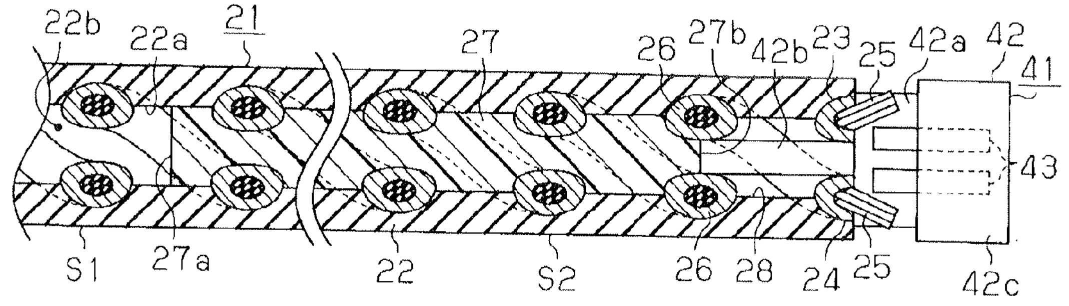
FIG. 9 is a partial cross-sectional view of the pressure sensitive sensor, showing another manufacturing step of the pressure sensitive sensor according to the embodiment.

Next, as shown in FIG. 9, a support portion inserting step is executed, so that the support portion 42*b* of the power supply connector 41 is inserted into the insertion gap 28. At this time, the support portion 42*b* is inserted into the inside of the hollow dielectric body 22 until the distal end of the support portion 42*b* contacts the second end 27*b* of the filler resin 27. A longitudinal position of the power supply connector 41 relative to the hollow dielectric body 22 is determined, i.e., is set by this contact between the support portion 42*b* and the filler resin 27. Furthermore, by the insertion of the support portion 42*b* into the insertion gap 28, the power supply connector 41 is supported relative to the hollow dielectric body 22 (the sensor cord 21).

Figure 10:
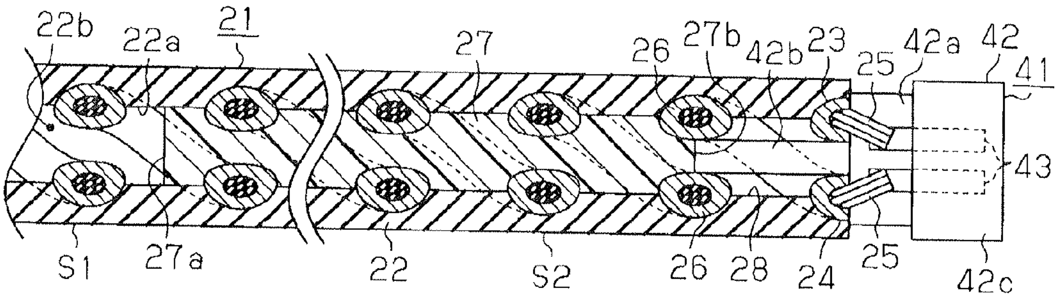
FIG. 10 is a partial cross-sectional view of the pressure sensitive sensor, showing another manufacturing step of the pressure sensitive sensor according to the embodiment.

Next, as shown in FIG. 10, a welding step is executed, so that the center electrodes 25 of the electrode wires 23, 24 are electrically connected by welding to the terminals 43, respectively, of the power supply connector 41, which are supported relative to the hollow dielectric body 22. The center electrodes 25 of the electrode wires 23, 24 are pulled out from the proximal end part of the hollow dielectric body 22 located at the non-sensor portion S2 side and are overlapped on the terminals 43, respectively. In this state, the welding is performed to weld between each of the center electrodes 25 of the electrode wires 23, 24 and the corresponding one of the terminals 43. In the present embodiment, the welding step and the support portion inserting step collectively serve as a power supply connector connecting step (step of installing the power supply connector to the hollow dielectric body 22).

Figure 11:
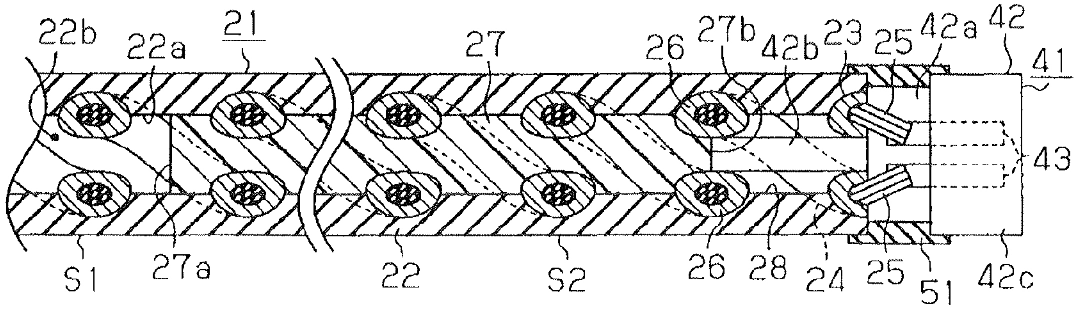
FIG. 11 is a partial cross-sectional view of the pressure sensitive sensor, showing another manufacturing step of the pressure sensitive sensor according to the embodiment.

Next, as shown in FIG. 11, a sealing step is executed, so that the connection between the hollow dielectric body 22 and the power supply connector 41 is covered with the seal member 51. In the sealing step, the cylindrical tubular seal member 51, which is made of the heat shrinkable tube and has not been shrunk yet, is fitted to the outer peripheral surfaces of the hollow dielectric body 22 and of the power supply connector 41 to cover the proximal end part of the hollow dielectric body 22 located at the non-sensor portion S2 side, the terminal holding portion 42*a* and the distal end part of the connecting portion 42*c* located at the terminal holding portion 42*a* side. Thereafter, the seal member 51 is heated and is thereby shrunk, so that the seal member 51 fluid-tightly contacts the hollow dielectric body 22 and the power supply connector 41. In this way, the manufacturing of the pressure sensitive sensor 11 is completed.

The connecting step of connecting the resistor 31 to the center electrodes 25 of the electrode wires 23, 24 and the forming step of forming the molded resin 32 (see FIG. 4) at the distal end part of the sensor cable 21 located at the sensor S1 side may be executed at any timing after the cutting step.

The present embodiment discussed above provides the following advantages.

(I) The hollow dielectric body 22 has the sensor portion S1, in which the filler resin 27 is not filled to enable the contact between the electrode wires 23, 24, and the non-sensor portion S2, in which the filler resin 27 is filled to disable the contact between the electrode wires 23, 24. Furthermore, the power supply connector 41 is provided at the proximal end part of the hollow dielectric body 22 located at the non-sensor portion S2 side and is adapted to be connected with the external connector, which is connected to an electric power source. Therefore, the non-sensor portion S2 can serve as the power supply lead lines. Thus, it is not required to electrically connect the separate lead lines, which is provided separately, to the electrode wires unlike the prior art, so that the number of the components can be advantageously reduced. Furthermore, the connecting step of connecting between the lead lines and the electrode wires of the pressure sensitive sensor can be eliminated according to the present embodiment, so that the manufacturing of the pressure sensitive sensor 11 can be advantageously simplified.

(II) The filling nozzle 81 is used to fill the molten resin material 82 into the inside of the hollow dielectric body 22 such that the insertion gap 28 is formed at the proximal end part of the hollow dielectric body 22 located at the non-sensor portion S2 side. The support portion 42*b* of the power supply connector 41 is inserted into, the insertion gap 28, so that the power supply connector 41 can be easily supported relative to the hollow dielectric body 22. Therefore, the position of the power supply connector 41 relative to the hollow dielectric body 22 can be easily stabilized. As a result, the welding between each of the electrode wires 23, 24 and the corresponding one of the terminals 43 is eased.

(III) The distal end of the support portion 42*b* contacts the second end 27*b* of the filler resin 27, so that the longitudinal position of the power supply connector 41 relative to the hollow dielectric body 22 can be easily set. Therefore, the positioning between each of electrode wires 23, 24 and the corresponding one of the terminals 43 can be easily performed, and thereby the good electrical connection between the electrode wires 23, 24 and the terminals 43 can be established.

(IV) The hollow dielectric body 22 is transparent, so that it is possible to visually check the filler resin 27, which is filled in the inside of the hollow dielectric body 22, from the outside of the hollow dielectric body 22. At the cutting step, the end 27*a* of the filler resin 27 located adjacent to the sensor portion S1 is used as the reference point S. The length of the sensor portion S1 and the length of the non-sensor portion S2 are measured from this reference point S, and the excess end segments of the hollow dielectric body 22 are cut. Therefore the length of the pressure sensitive sensor 11 can be easily adjusted. Furthermore, at the time of installing the pressure sensitive sensor 11 to the door panel 5, it is easy to visually distinguish between the sensor portion S1 and the non-sensor portion S2 from the outside of the hollow dielectric body 22. Therefore, the installation of the pressure sensitive sensor 11 to the door panel 5 can be easily performed.

(V) The seal member 51 fluid-tightly covers the connection between the hollow dielectric body 22 and the power supply connector 41. Therefore, it is possible to limit intrusion of fluid into the inside of the hollow dielectric body 22 through the connection between the hollow dielectric body 22 and the power supply connector 41.

The above embodiment of the present invention may be modified as follows.

In the above embodiment, the seal member 51 is made of the heat shrinkable tube. However, the seal member 51 is not limited to the heat shrinkable tube. That is, the seal member 51 can be made of any other material as long, as it can fluid-tightly cover the connection between the hollow dielectric body 22 and the power supply connector 41. Furthermore, the pressure sensitive sensor 11 is not required to have the seal member 51, so that the seal member 51 may be eliminated in some cases.

In the above embodiment, the hollow dielectric body 22 is transparent. Alternatively, the hollow dielectric body 22 may be semitransparent. Even with this modification, the advantage similar to the one discussed in the above section (IV) can be achieved. Furthermore, the hollow dielectric body 22 may be opaque, if desired. Also, the above manufacturing method may include a step of forming the hollow dielectric body 22 from the resilient material (e.g., the soft resin material or rubber material), which is transparent, semitransparent or opaque, such that each of the electrode wires 23, 24 is at least partially insert molded, i.e., embedded in the resilient material before the filling step.

In the above embodiment, the distal end of the support portion 42*b* of the power supply connector 41 contacts the second end 27*b* of the filler resin 27. However, the support portion 42*b* may not need to contact the filler resin 27. Also, the support portion 42*b* may be eliminated from the power supply connector 41, if desired.

In the above embodiment, the insertion gap 28 is provided in the proximal end part of the hollow dielectric body 22 located at the non-sensor S2 side, and the power supply connector 41 is supported relative to the hollow dielectric body 22 in the state where the support portion 42*b* is inserted into the insertion gap 28. Alternatively, the insertion gap 28 may be eliminated from the hollow dielectric body 22, if desired. In such a case, the power supply connector 41 may be installed to the hollow dielectric body 22 such that the support portion 42*b* is forcefully inserted into the inside of the hollow dielectric body 22 from the proximal end part of the hollow dielectric body 22 located at the non-sensor S2 side. Furthermore, the support portion 42*b* may be eliminated from the power supply connector 41, if desired. In such a case, the power supply connector 41 may be installed to the proximal end part of the hollow dielectric body 22 located at the non-sensor S2 side.

In the cutting step of the above embodiment, the required length of the sensor portion S1 and the required length of the non-sensor portion S2 are measured, and the excess end segments are cut and removed. Alternatively, at the cutting step, only the required length of the sensor portion S1 or the required length of the non-sensor portion S2 may be measured, and the corresponding excess end segment may be cut and removed. Even with modification, the length of the pressure sensitive sensor 11 can be easily adjusted. Furthermore, after the solidifying step, the support portion inserting step may be executed without executing the cutting step. In such a case, the connecting step of connecting the resistor 31 to the center electrodes 25 of the electrode wires 23, 24 and the forming step of forming the molded resin 32 at the distal end part of the sensor cable 21 located at the sensor S1 side may be executed at any timing after the solidifying step.

In the above embodiment, the pressure sensitive sensor 11 includes the two electrode wires 23, 24. However, the number of the electrode wires of the pressure sensitive sensor 11 is not limited to two and may be increased to three or more.

Each of the electrode wires 23, 24 may be made as a solid core wire (single wire), such as an annealed copper wire.

In the above embodiment, the power supply sensing device 73 supplies the electric current at the predetermined constant voltage and outputs the pressure detection signal upon the sensing of the change in the current value caused by the contact between the electrode wires 23, 24. Alternatively, the power supply sensing device 73 may be configured such that the power supply sensing device 73 outputs the pressure detection signal when it senses a change in a voltage value of the electric power caused by the contact between the electrode wires 23, 24.

In the above embodiment, when the door ECU 74 receives the pressure detection signal, the door ECU 74 reverses the drive direction of the sliding door actuator 6 to drive the door panel 5 for the predetermined distance in the opening direction thereof and stops the slide actuator 6. Alternatively the door ECU 74 may be configured to stop the slide actuator 6 based on the pressure detection signal. Further alternatively, the door ECU 74 may be configured to reverse the drive direction of the slide actuator 6 based on the pressure detection signal to drive the door panel 5 to the full open position Po and then to stop the slide actuator 6.

In the above embodiment, the sensor portion S1 of the sensor cable 21 is placed along the front end part 5*a* of the door panel 5. Alternatively, the sensor portion S1 of the sensor cable 21 may be placed to a section of the inner peripheral part of the entrance/exit opening 4, which is opposed to the front end part 5*a* of the door panel 5 in the front-to-rear direction of the vehicle 2.

In the present embodiment, the pressure sensitive sensor 11 is provided to the power sliding door apparatus 1, which drives the door panel 5 of the vehicle 2 with the drive force of the motor 7, and the pressure sensitive sensor 11 is adapted to detect the foreign object X that is present between the inner peripheral part of the entrance/exit opening 4 and the front end part 5*a* of the door panel 5. Alternatively, the pressure sensitive sensor 11 of the present invention may be placed to any other type of opening and closing apparatus, which opens or closes a corresponding opening by driving a corresponding panel body with a drive force of an electric motor, such that the pressure sensitive sensor 11 is adapted to detect the foreign object X present between an inner peripheral part of the opening and the panel body. Furthermore, the pressure sensitive sensor 11 may be provided to any other type of apparatus, which is other than the opening and closing apparatus to sense an urging force applied to the sensor portion S1.

Additional advantages and modifications will readily occur to those skilled in the art. The invention in its broader terms is therefore not limited to the specific details, representative apparatus, and illustrative examples shown and described.

What is claimed is:

1. A manufacturing method of a pressure sensitive sensor that includes a hollow dielectric body, which is elongated and is resiliently deformable, and a plurality of electrode wires, which are normally spaced from each other while being opposed to each other in an inside of the hollow dielectric body and are contactable with each other upon bending of at least one of the plurality of electrode wires caused by resilient deformation of the hollow dielectric body, the manufacturing method comprising:

filling a molten dielectric resin material into a section of the inside of the hollow dielectric body, in which the plurality of electrode wires is installed, to provide a non-sensor portion in the section of the inside of the hollow dielectric body filled with the molten dielectric resin material;

solidifying the molten dielectric resin material to form filler resin after the filling of the molten dielectric resin material, so that a sensor portion, in which the filler resin is not filled in the inside of the hollow dielectric body, and the non-sensor portion, in which the filler resin is filled in the inside of the hollow dielectric body, are formed; and installing a power supply connector having a plurality of electrically conductive terminals to one end part of the hollow dielectric body located at the non-sensor portion side such that the plurality of electrically conductive terminals is electrically connected to the plurality of electrode wires after the solidifying of the molten dielectric resin material.

2. The manufacturing method according to claim 1, further comprising:

inserting a filling nozzle, from which the molten dielectric material is filled into the section of the hollow dielectric body, into the inside of the hollow dielectric body such that a distal end of the filling nozzle is inserted into the inside of the hollow dielectric body through the one end part of the hollow dielectric body before the filling of the molten dielectric resin material; and forming an insertion gap in a space of the hollow dielectric body, in which the filling nozzle is located upon the inserting of the filling nozzle, by removing the filling nozzle from the hollow dielectric body after the filling of the molten dielectric resin material, wherein the installing of the power supply connector includes:

inserting a support portion, which projects from the rest of the power supply connector, into the insertion gap, so that the power supply connector is supported by the hollow dielectric body; and joining the plurality of electrically conductive terminals to the plurality of electrode wires after the inserting of the support portion.

3. The manufacturing method according to claim 2, wherein the installing of the power supply connector includes contacting a distal end of the support portion to the filler resin, so that the power supply connector is supported by the hollow dielectric body.

4. The manufacturing method according to claim 1, wherein the hollow dielectric body is transparent or semi-transparent, and the manufacturing method further comprising:

cutting at least one excess segment from the hollow dielectric body before the installing of the power supply connector by measuring a required length of at least one of the sensor portion and the non-sensor portion from a reference point, which is an end of the filler resin located adjacent to the sensor portion, and then cutting the at least one excess segment, which does not include the required length of the at least one of the sensor portion and the non-sensor portion.

5. The manufacturing method according to claim 1, further comprising fluid-tightly sealing a connection between the hollow dielectric body and the power supply connector with a seal member after the installing of the power supply connector.

6. A pressure sensitive sensor comprising:

a hollow dielectric body, which is elongated and is resiliently deformable; and a plurality of electrode wires, which are normally spaced from each other while being opposed to each other in an inside of the hollow dielectric body and are contactable with each other upon bending of at least one of the plurality of electrode wires caused by resilient deformation of the hollow dielectric body, wherein:

the hollow dielectric body, in which the plurality of electrode wires is installed, includes:

a sensor portion, in which dielectric filler resin is not filled in the inside of the hollow dielectric body to enable contact of the plurality of electrode wires with each other; and a non-sensor portion, in which the filler resin is filled in the inside of the hollow dielectric body to disable the contact of the plurality of electrode wires with each other; and a power supply connector is installed to one end part of the hollow dielectric body located at the non-sensor portion side and includes a plurality of electrically conductive terminals that are electrically connected to the plurality of electrode wires.

7. The pressure sensitive sensor according to claim 6, wherein:

an insertion gap, in which the filler resin is not filled, is provided in the inside of the one end part of the hollow dielectric body located at the non-sensor portion side; and the power supply connector includes a support portion that is inserted into the insertion gap.

8. The pressure sensitive sensor according to claim 7, wherein a distal end of the support portion contacts the filler resin in the inside of the hollow dielectric body.

9. The pressure sensitive sensor according to claim 6, wherein the hollow dielectric body is transparent or semi-transparent.

10. The pressure sensitive sensor according to claim 6, further comprising a seal member, which fluid-tightly seals a connection between the hollow dielectric body and the power supply connector.

* * * * *